(12) United States Patent
Yu et al.

(10) Patent No.: US 8,610,139 B2
(45) Date of Patent: Dec. 17, 2013

(54) SOLID STATE LIGHT SOURCE MODULE AND ARRAY THEREOF

(75) Inventors: Chang-Chin Yu, Zhubei (TW); Mong-Ea Lin, Zhubei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/448,643

(22) Filed: Apr. 17, 2012

(65) Prior Publication Data

US 2013/0062634 A1    Mar. 14, 2013

(30) Foreign Application Priority Data

Sep. 14, 2011 (TW) .............................. 100133037 A

(51) Int. Cl.
*H01L 33/48* (2010.01)

(52) U.S. Cl.
USPC ................. 257/88; 257/92; 257/98; 257/678; 257/723; 257/E33.062; 257/E33.056; 257/E33.055; 438/29; 438/34

(58) Field of Classification Search
USPC ................ 257/88, 92, 98, 678, 723, E33.062, 257/E33.056, E33.055; 438/29, 34
See application file for complete search history.

(56) References Cited

U.S. PATENT DOCUMENTS

| | | | | |
|---|---|---|---|---|
| 5,311,407 A | * | 5/1994 | Lumbard | 361/813 |
| 6,590,773 B1 | * | 7/2003 | Lin | 361/704 |
| 6,715,901 B2 | * | 4/2004 | Huang | 362/294 |
| 7,262,438 B2 | * | 8/2007 | Mok et al. | 257/98 |
| 7,547,922 B2 | * | 6/2009 | Tan et al. | 257/88 |
| 7,683,475 B2 | | 3/2010 | Lee et al. | |
| 7,737,452 B2 | * | 6/2010 | Biar et al. | 257/88 |
| 7,810,953 B2 | * | 10/2010 | Hsu | 362/264 |
| 7,821,023 B2 | | 10/2010 | Yuan et al. | |
| 7,897,991 B2 | * | 3/2011 | Chang | 257/99 |
| 8,079,139 B1 | * | 12/2011 | Lin et al. | 29/825 |
| 8,220,956 B2 | * | 7/2012 | Lai et al. | 362/218 |
| 8,368,190 B2 | * | 2/2013 | Lee et al. | 257/666 |
| 8,384,114 B2 | * | 2/2013 | Tischler et al. | 257/98 |
| 2006/0163589 A1 | * | 7/2006 | Fan et al. | 257/88 |
| 2009/0050908 A1 | * | 2/2009 | Yuan et al. | 257/88 |
| 2011/0140135 A1 | * | 6/2011 | Lee et al. | 257/88 |
| 2011/0241054 A1 | * | 10/2011 | Lee et al. | 257/98 |
| 2012/0056215 A1 | * | 3/2012 | Lee et al. | 257/88 |
| 2012/0097996 A1 | * | 4/2012 | Lee et al. | 257/88 |
| 2012/0193652 A1 | * | 8/2012 | Horng et al. | 257/88 |
| 2012/0193653 A1 | * | 8/2012 | Horng et al. | 257/88 |
| 2012/0217862 A1 | * | 8/2012 | Matsuda et al. | 313/46 |
| 2012/0261693 A1 | * | 10/2012 | Chen | 257/98 |
| 2012/0307491 A1 | * | 12/2012 | Chen et al. | 362/235 |

* cited by examiner

*Primary Examiner* — Bac Au
*Assistant Examiner* — Victor Barzykin
(74) *Attorney, Agent, or Firm* — McClure, Qualey & Rodack, LLP

(57) ABSTRACT

A solid state light source array including a transparent substrate and N rows of solid state light emitting element series is provided. Each row of the solid state light emitting element series includes M solid state light emitting elements connected in series, wherein N, M are integers and N≥1, M≥2. Each of the solid state emitting elements includes a first type electrode pad and a second type electrode pad. The first and the $M^{th}$ solid state emitting elements of each row of the solid state light emitting element series are electrically connected to a first conductive line and a second conductive line located on the edges of the first surface via the first type electrode pad and the second type electrode pad, respectively. The first conductive line and the second conductive line are physically disconnected.

10 Claims, 4 Drawing Sheets

SOLID STATE LIGHT SOURCE MODULE AND ARRAY THEREOF

This application claims the benefit of Taiwan application Serial No. 100133037, filed Sep. 14, 2011, the subject matter of which is incorporated herein by reference.

BACKGROUND OF THE INVENTION

1. Field of the Invention

The invention relates in general to a light source module, and more particularly to a solid state light source module and a solid state light source array.

2. Description of the Related Art

The light-emitting diode (LED) emits a light by converting electric energy into photo energy. The LED is mainly composed of semiconductors. Of the semiconductors, those having a larger ratio of holes carrying positive electricity are referred as P type semiconductors, and those having a larger ratio of electrons carrying negative electricity are referred as N type semiconductors. The junction connecting a P type semiconductor and an N type semiconductor forms a PN junction. When a voltage is applied to the positive polarity and negative polarity of a LED chip, the electrons and the holes will be combined and emitted in the form of a light.

Conventionally, the LEDs are flatly disposed on a heat-dissipation substrate. Since a part of the light is reflected or absorbed by the heat-dissipation substrate, the light can only be emitted from one single side, and the expected illumination effect cannot be achieved. According to the conventional method, LEDs are bonded to two electrode pins by way of wire bonding, and are only applicable for one single point light source. When it comes to the large-sized array light source module, the conventional method is unable to effectively increase the light emitting area due to the restriction of the area of substrate, and has plenty of room for improvement.

SUMMARY OF THE INVENTION

The invention is directed to a solid state light source module and a solid state light source array. Through the arrangement of the solid state emitting elements in a plane array, the transparent substrate is fixed by being vertically inserted into the heat-dissipation base, so that the light emitting area and volume are both increased, and the illumination zone is expanded, and the double-sided light-emitting effect can thus be achieved.

According to one embodiment of the invention, a solid state light source module including a transparent substrate, N rows of solid state light emitting element series and a dissipation base is provided. The transparent substrate has a first surface and a second surface which are parallel and opposite to each other. N rows of solid state light emitting element series are disposed on the first surface. Each row of the solid state light emitting element series includes M solid state light emitting elements connected in series, wherein N, M are integers and N≥1, M≥2. Each of the solid state emitting elements includes a first type electrode pad and a second type electrode pad. The first solid state emitting element of each row of the solid state light emitting element series is electrically connected to a first conductive line located on the edge of the first surface via the first type electrode pad thereof. The Mth solid state emitting element of each row of the solid state light emitting element series is electrically connected to a second conductive line on the edge of first surface via the second type electrode pad thereof. The first conductive line and the second conductive line are physically disconnected.

The heat-dissipation base is formed by a first heat-dissipation base and a second heat-dissipation base separated from each other. The first heat-dissipation base and the second heat-dissipation base includes a first slot having a first type electrode portion and a second slot having a second type electrode portion, so that the transparent substrate is fixed after being inserted into the first slot and the second slot, and the first and the second conductive lines located on the edges of the first surface of the transparent substrate are electrically connected to the first type and the second type electrode portions, respectively.

According to one alternate embodiment of the invention, a solid state light source array including a transparent substrate and N rows of solid state light emitting element series is provided. The transparent substrate has a first surface and a second surface which are parallel and opposite to each other. N rows of solid state light emitting element series are disposed on the first surface. Each row of the solid state light emitting element series includes M solid state light emitting elements connected in series, wherein N, M are integers and N≥1, M≥2. Each of the solid state emitting elements includes a first type electrode pad and a second type electrode pad. The first solid state emitting element of each row of the solid state light emitting element series is electrically connected to a first conductive line located on the edge of the first surface via the first type electrode pad thereof. The Mth solid state emitting element of each row of the solid state light emitting element series is electrically connected to a second conductive line on the edge of first surface via the second type electrode pad thereof. The first conductive line and the second conductive line are physically disconnected.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the light source module of the embodiment, the light source is realized by the solid state light source array formed by the solid state emitting elements which emit the light from two sides. The solid state emitting elements, such as LEDs, may be realized by a semiconductor epitaxial structure made from nitrides formed by elements of the IIIA group. The semiconductor structure includes a second type semiconductor layer, an active layer and a first type semiconductor layer in order. A part of the second type semiconductor layer is exposed to the outside. The first type electrode pad of the solid state emitting elements may be formed on the first type semiconductor layer. The second type electrode pad may be formed on the exposed second type semiconductor layer. The transparent substrate is fixed by being vertically inserted into the slot of the heat-dissipation base, such that the light emitted by the solid state emitting elements is through two opposite surfaces of the transparent substrate. Through the arrangement of the solid state emitting elements in a plane array, the light emitting area and volume are both increased, and the illumination zone is expanded, and the double-sided light-emitting effect can thus be achieved.

A number of embodiments are disclosed below for elaborating the invention. However, the embodiments of the invention are for detailed descriptions only, not for limiting the scope of protection of the invention.

First Embodiment

Figure 1A:
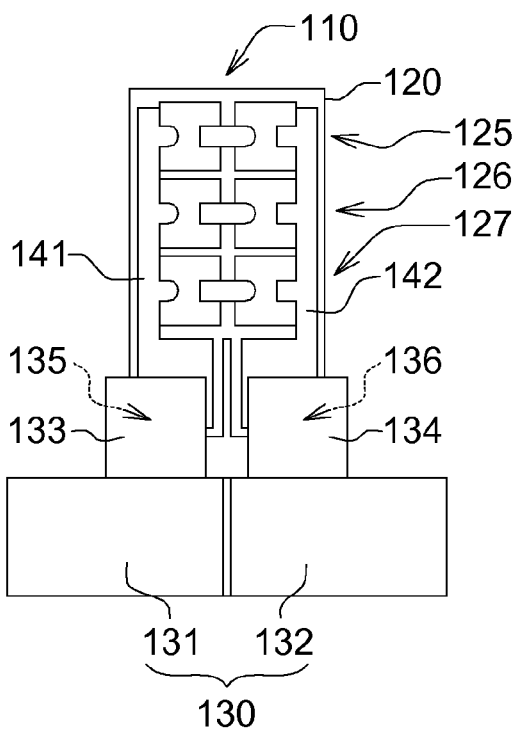
FIGS. 1A and 1B respectively show a front view and a side view of a solid state light source module according to one embodiment of the invention.
Figure 1B:
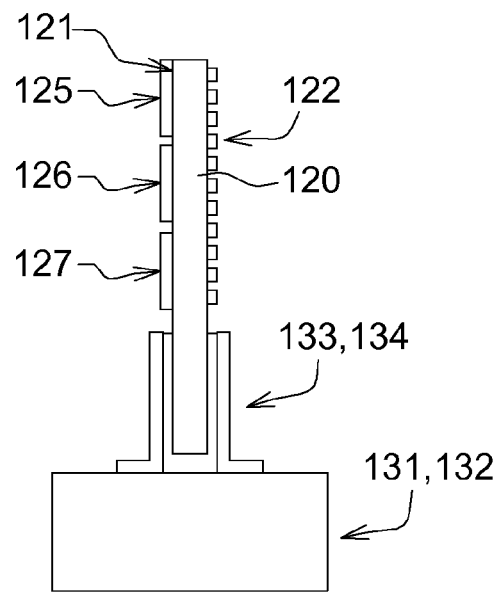

Referring to FIGS. 1A and 1B, a front view and a side view of a solid state light source module according to one embodiment of the invention are respectively shown. The solid state light source module 100 includes a solid state light source array 110 and a heat-dissipation base 130. The heat-dissipation base 130 is formed by a first heat-dissipation base 131 and a second heat-dissipation base 132 separated from each other. The first heat-dissipation base 131 has a first slot 133. The second heat-dissipation base 132 has a second slot 134. The first slot 133 has a first type electrode portion 135. The second slot 134 has a second type electrode portion 136. The first type electrode portion 135 and the second type electrode portion 136 have opposite electrical properties, and are used for connecting an external power and providing the required driving voltage for the solid state light source array 110 to emit the light.

The solid state light source array 110 includes a transparent substrate 120 and N rows of solid state light emitting element series 125~127. The transparent substrate 120 has a first surface 121 and a second surface 122 which are parallel and opposite to each other. The first surface 121 has N rows of solid state light emitting element series. Each row of the solid state light emitting element series includes M solid state light emitting elements connected in series. N, M are integers and N≥1, M≥2. The second surface 122 may be a rough surface having a convex-concave structure. The rough surface help to avoid the emitted light being totally reflected from the second surface 122 of the transparent substrate 120, so that the light emitting efficiency can be improved.

According to one embodiment of the invention shown in FIG. 1A, the first surface 121 has 3 rows of solid state light emitting element series 125~127, and each row of the solid state light emitting element series 125~127 includes 2 solid state light emitting elements connected in series.

The light emitting element series may be arranged in one or more than one row. Each row of the solid state light emitting element series includes two or more than two solid state emitting elements connected in series. The number of solid state emitting elements included in a row is not restricted.

Figure 2A:
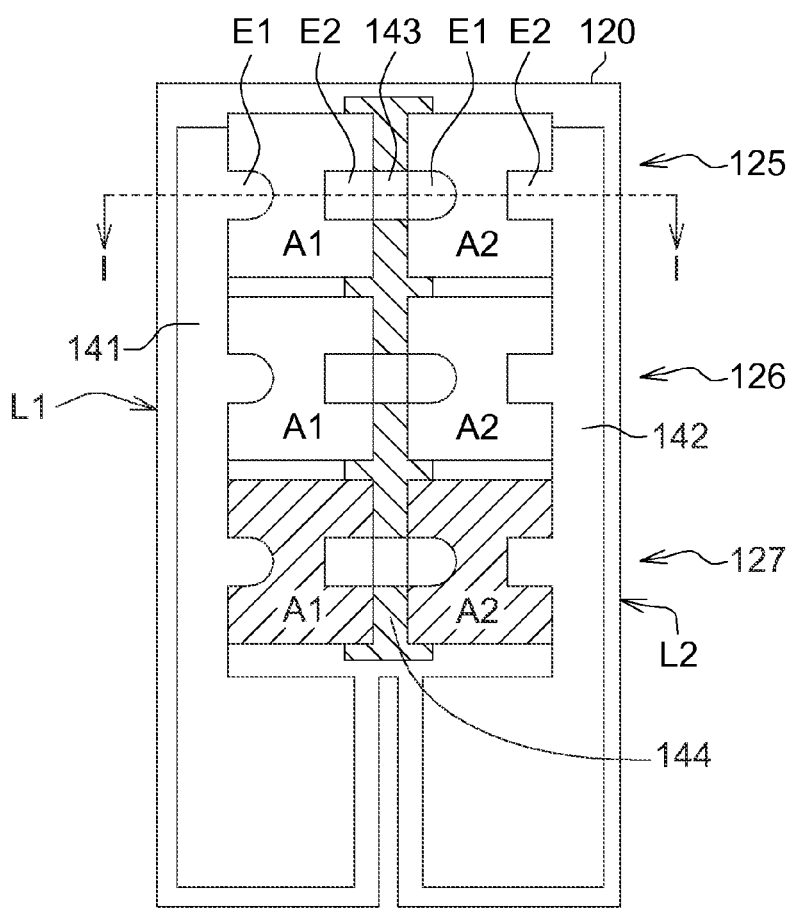
FIGS. 2A and 2B respectively show a schematic diagram of a solid state light source array and a cross-sectional view along the cross-sectional line I-I according to one embodiment of the invention.
Figure 2B:
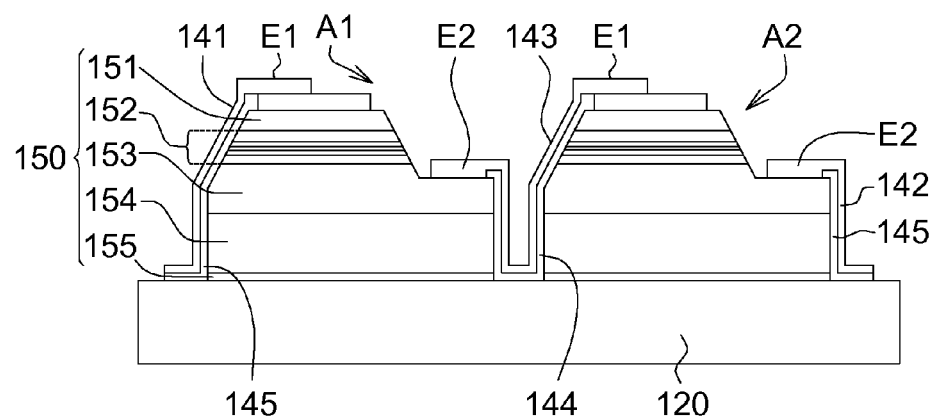

Referring to FIGS. 2A and 2B, a schematic diagram of a solid state light source array and a cross-sectional view along the cross-sectional line I-I according to one embodiment of the invention are respectively shown.

As shown in FIG. 2B, the solid state emitting elements, such as LED 150, includes a second type semiconductor layer 153, an active layer 152 and a first type semiconductor layer 151 which are sequentially formed on the transparent substrate 120.

The emitting elements are disposed on the first surface 121 of the transparent substrate 120 and are arranged in the form of an array. Each of the solid state emitting elements includes a first type electrode pad E1 and a second type electrode pad E2. As shown in FIG. 2B, after each of the solid state emitting elements is patterned, a part of the second type semiconductor layer 153 is exposed outside to form a mesa structure. The first type electrode pad E1 of the solid state emitting elements is formed on the first type semiconductor layer 151. The second type electrode pad E2 is formed on the exposed second type semiconductor layer 153. The active layer 152 interposed between the first type semiconductor layer 151 and the second type semiconductor layer 153 may include multiple quantum well layers.

The first type semiconductor layer 151 may be realized by a nitride semiconductor layer doped with P type impurities. The second type semiconductor layer 153 may be realized by a nitride semiconductor layer doped with N type impurities. The first type semiconductor layer 151 and the second type semiconductor layer 153 may be realized by a P type semiconductor layer and an N type semiconductor layer having opposite electrical properties, and may be realized by nitrides such as GaN, AlGaN, InGaN or AlInGaN formed by elements of the IIIA group of the Periodic Table. The first type electrode pad E1 is P polarity, and the second type electrode pad E2 is N polarity.

The LED 150 may further include a non-doped semiconductor layer 154 interposed between the second type semiconductor layer 153 and the transparent substrate 120. The LED 150 may be realized by a non-doped semiconductor layer 154 made from nitrides formed by elements of the IRA group of the Periodic Table. The LED 150 may further includes a buffer layer 155 interposed between non-doped semiconductor layer 154 and the transparent substrate 120. The buffer layer 155 is made from materials selected from the group composed of AlN or AlGaN. The transparent substrate 120, such as a sapphire substrate. A buffer layer 155 is formed on the transparent substrate 120 and the epitaxial layer can then be sequentially formed to obtain GaN crystal with superior quality.

As shown in FIGS. 2A and 2B, the first solid state emitting element of each row of the solid state light emitting element series is electrically connected to a first conductive line 141 located on the edge of the first surface 121 (adjacent to the first lateral side L1) via the first type electrode pad E1, and the last one (that is, the M-th, and M is an integers larger than or equal to 2) solid state emitting element of each row of the solid state light emitting element series is electrically connected to a second conductive line 142 located on the edge of the first surface 121 (adjacent to the second lateral side L2) via the second type electrode pad E2. Besides, the second type electrode pad E2 of the (i−1) Th (2≤i≤M, i is an integers) solid state emitting element of each row of the solid state light emitting element series and the first type electrode pad E1 of the ith solid state emitting element are connected by a third conductive line 143. That is, the third conductive line 143 connects each row of M solid state emitting elements in series.

As shown in FIG. 2A, the solid state light emitting element series 125 has two solid state emitting elements A1 and A2 connected in series, and both the solid state emitting elements A1 and A2 have a first type electrode pad E1 (P polarity) and a second type electrode pad E2 (N polarity). The first type electrode pad E1 (P polarity) of the solid state emitting elements A1 is electrically connected to the first conductive line 141. The second type electrode pad E2 (N polarity) of the solid state emitting elements A1 is electrically connected to the first type electrode pad E1 (P polarity) of the solid state emitting elements A2. The second type electrode pad E2 (N polarity) of the solid state emitting elements A2 is electrically connected to the second conductive line 142. Similarly, the solid state light emitting element series 126 and 127 are identical to the solid state light emitting element series 125, and are not repeated here.

As shown in FIG. 2B, when the third conductive line 143 passes through the part between the first solid state emitting element A1 and the second solid state emitting element A2, a dielectric layer 144 may be formed under the third conductive line 143 except the positions of the first type electrode pad E1 and the second type electrode pad E2 to avoid short-circuiting. When the first conductive line 141 and the second conductive line 142 respectively pass through the first solid state emitting element A1 and the last solid state emitting element A2, a dielectric layer 145 may be formed under the first conductive line 141 and the second conductive line 142 respectively to avoid short-circuiting. In terms of structure, the first conductive line 141 and the second conductive line 142 are not connected to each other, and respectively correspond to the first type electrode portion 135 inside the first slot 133 and the second type electrode portion 136 inside the second slot 134. The first type electrode portion 135 is P polarity, and the second type electrode portion 136 is N polarity.

As shown in FIG. 1A, the transparent substrate 120 is vertically inserted into two slots 133 and 134 of the heat-dissipation base 130 and becomes fixed. The first conductive line 141 located on the edge of the first surface 121 of the transparent substrate 120 is electrically connected to the first type electrode portion 135. The second conductive line 142 is electrically connected to the second type electrode portion 136. Therefore, when the solid state emitting elements illuminate, the emitted light travels through the first surface 121 and the second surface 122 of the transparent substrate 120, and the double-sided light emitting effect is thus achieved. Through the arrangement of the solid state emitting elements in a plane array, the transparent substrate 120 is vertically inserted into the slots of the heat-dissipation base 130, the light emitting area and volume are both increased, and the illumination zone is expanded, and the double-sided light-emitting effect can thus be achieved.

Second Embodiment

Figure 3:
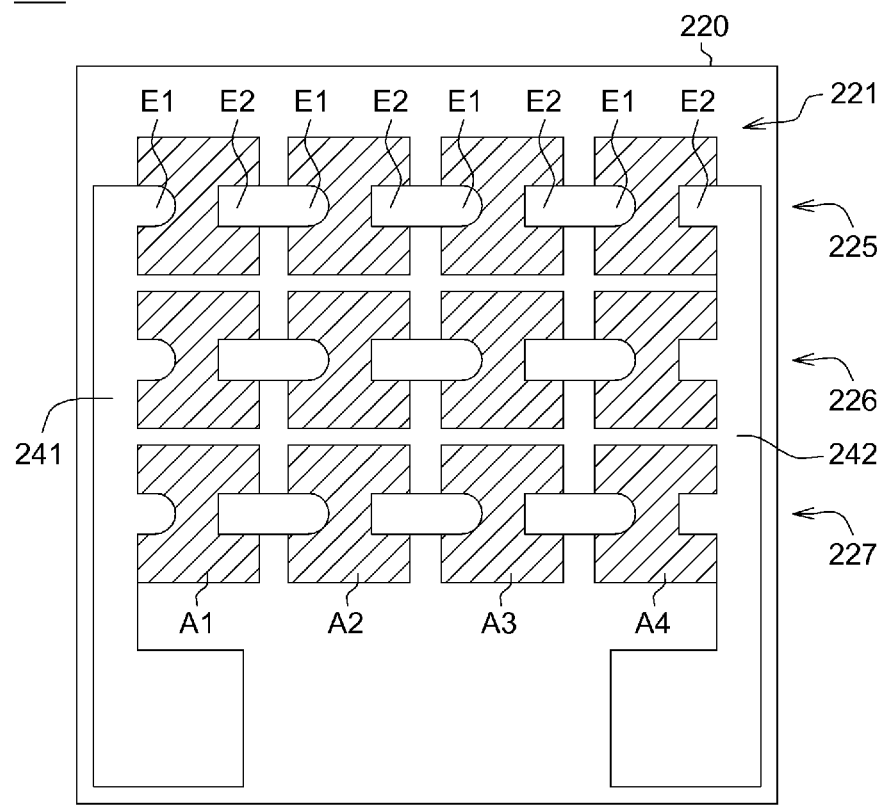
FIG. 3 shows a schematic diagram of a solid state light source array according to one alternate embodiment of the invention.

Referring to FIG. 3, a schematic diagram of a solid state light source array 210 according to one alternate embodiment of the invention is shown. Three solid state light emitting element series 225, 226 and 227 are located on the first surface 221 of the transparent substrate 220. Each of the solid state light emitting element series 225~227 has four solid state emitting elements A1~A4 connected in series. The solid state emitting elements A1~A4 all have a first type electrode pad E1 (P polarity) and a second type electrode pad E2 (N polarity). The first type electrode pad E1 (P polarity) of the solid state emitting elements A1 is electrically connected to the first conductive line 241. The second type electrode pad E2 (N polarity) of the solid state emitting elements A1 is electrically connected to the first type electrode pad E1 (P polarity) of the solid state emitting elements A2. The second type electrode pad E2 (N polarity) of the solid state emitting elements A2 is electrically connected to the first type electrode pad E1 (P polarity) of the solid state emitting elements A3. The second type electrode pad E2 (N polarity) of the solid state emitting elements A3 is electrically connected to the first type electrode pad E1 (P polarity) of the solid state emitting elements A4. The second type electrode pad E2 (N polarity) of the solid state emitting elements A4 is electrically connected to the second conductive line 242. Similarly, the solid state light emitting element series 226 and 227 are identical to the solid state light emitting element series 225, and are not repeated here.

The transparent substrate 220 is vertically inserted into two slots 133 and 134 of the heat-dissipation base 130 and becomes fixed. The first conductive line 241 located on the edge of the first surface 221 of the transparent substrate 220 is electrically connected to the first type electrode portion 135. The second conductive line 242 is electrically connected to the second type electrode portion 136. Therefore, when the solid state emitting elements illuminate, the emitted light travels through two opposite surfaces of the transparent substrate 220

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A solid state light source module, comprising:
a transparent substrate having a first surface and a second surface which are parallel and opposite to each other;
N rows of solid state light emitting element series disposed on the first surface, wherein each row of the solid state light emitting element series comprises M solid state light emitting elements connected in series, N, M are integers and N≥1, M≥2, each of the solid state emitting elements comprises a first type electrode pad and a second type electrode pad, the first solid state emitting element of each row of the solid state light emitting element series is electrically connected to a first conductive line located on the edge of the first surface via the first type electrode pad thereof, the $M^{th}$ solid state emitting element of each row of the solid state light emitting element series is electrically connected to a second conductive line on the edge of first surface via the second type electrode pad thereof, and the first conductive line and the second conductive line are physically disconnected; and
a heat-dissipation base formed by a first heat-dissipation base and a second heat-dissipation base separated from each other, wherein the first heat-dissipation base and the second heat-dissipation base respectively have a first slot having a first type electrode portion and a second slot having a second type electrode portion, so that the transparent substrate is fixed after being inserted into the first slot and the second slot, and the first and the second conductive lines located on the edges of the first surface of the transparent substrate are electrically connected to the first type and the second type electrode portions, respectively.

2. The solid state light source module according to claim 1, wherein the second surface has a convex-concave structure.

3. The solid state light source module according to claim 1, wherein the solid state emitting elements are light-emitting diodes (LEDs).

4. The solid state light source module according to claim 3, wherein each of the LEDs comprises a second type semiconductor layer, an active layer and a first type semiconductor layer sequentially formed on the transparent substrate.

5. The solid state light source module according to claim 4, wherein each of the LEDs is patterned as a mesa structure exposing a part of the second type semiconductor layer.

6. The solid state light source module according to claim 5, wherein the first type electrode pad of each of the LEDs is formed on the first type semiconductor layer and the second type electrode pad is formed on the exposed second type semiconductor layer.

7. The solid state light source module according to claim 6, wherein in each row of the solid state light emitting element series, the second type electrode pad of the $(i-1)T^h$ solid state emitting element and the first type electrode pad of the $i^{th}$ solid state emitting element are connected by a third conductive line, i is an integer and $2 \leq i \leq M$.

8. The solid state light source module according to claim 7, wherein a dielectric layer is formed under the third conductive line along the trace of the third conductive line except the positions of the first type electrode pad and the second type electrode pad.

9. The solid state light source module according to claim 8, wherein each of the LEDs further comprises a non-doped semiconductor layer interposed between the second type semiconductor layer and the transparent substrate.

10. The solid state light source module according to claim 9, wherein each of the LEDs further comprises a buffer layer interposed between the non-doped semiconductor layer and the transparent substrate.

* * * * *